(12) United States Patent
Hatanaka

(10) Patent No.: US 6,691,292 B2
(45) Date of Patent: Feb. 10, 2004

(54) INTEGRATED CIRCUIT AND LAYOUT METHOD FOR THE SAME USING BLANK AREA OF MACROCELL

(75) Inventor: Koujiro Hatanaka, Kanagawa-ken (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 8 days.

(21) Appl. No.: 09/798,782

(22) Filed: Mar. 2, 2001

(65) Prior Publication Data

US 2002/0005572 A1 Jan. 17, 2002

(30) Foreign Application Priority Data

Mar. 2, 2000  (JP) ..................................... P2000-057492

(51) Int. Cl.[7] ............................................. G06F 17/50
(52) U.S. Cl. ................... 716/8; 716/1; 716/13; 716/21
(58) Field of Search ........................... 716/8, 1, 21, 13

(56) References Cited

U.S. PATENT DOCUMENTS 5,798,936 A * 8/1998 Cheng .......................... 716/13
5,987,086 A * 11/1999 Raman et al. .................. 716/1
6,298,473 B1 * 10/2001 Ono et al. ..................... 716/21
6,421,816 B1 * 7/2002 Ishikura ......................... 716/1

FOREIGN PATENT DOCUMENTS

| JP | 05-259283 | 8/1993 | ........... H01L/21/82 |
| JP | 09-008142 | 10/1997 | ........... H01L/21/82 |

* cited by examiner

*Primary Examiner*—Vuthe Siek
*Assistant Examiner*—Thuan Do
(74) *Attorney, Agent, or Firm*—Gray Cary Ware & Freidenrich, LLP

(57) ABSTRACT

The present invention is to provide an integrated circuit, a macrocell and method of layout for an integrated circuit capable of reduction in chip area using an area in macrocells. The macrocell according to the invention has concavity-shaped, and an integration circuit of the present invention includes a concave macrocell. The layout method according to this invention comprises, inputting a target macrocell, searching for blank areas in the macrocell, replacing the macrocell with a macrocell that the blank area searched is removed; and layout the integrated circuit using the macrocell that the blank area searched is removed. A macrocell excluding the non-circuit areas be used efficiently so that reduction in chip area can be realized by using the integrated circuit including the macrocell according to this invention.

17 Claims, 8 Drawing Sheets

INTEGRATED CIRCUIT AND LAYOUT METHOD FOR THE SAME USING BLANK AREA OF MACROCELL

CROSS REFERENCE TO RELATED APPLICATIONS

This application claims benefit of priority under 35 USC 119 based on Japanese patent application P2000-57492 filed Mar. $2^{nd}$, 2000, the entire contents of which are incorporated by reference herein.

BACKGROUND OF THE INVENTION

1. Field of the Invention

The present invention relates to an integrated circuit such as LSI (Large-Scale Integration) including macro cells, more particularly, to a method of layout for the integrated circuit including macrocells.

2. Description of Related Art

FIG. 1 illustrates a layout of an LSI including macrocells in related art. A macrocell A comprises a circuit area 23 that is an area that has a circuit or circuits, and a non-circuit area 7 that is an area that has no circuits. In prior art, this macrocell A is treated as a macrocell that terminal group 1 extends to an upper side 3 and terminal group 2 extends to a right side 4.

In the layout of integrated circuits using macrocell A, the quadrilateral area defined as the macrocell A is treated as a wiring prohibition area for wiring layer used in macrocell A.

In this way, the area 7 is treated as a wiring prohibition area. Then, macrocell B is placed the area 7 closed to, but not overlapped with, the vertex 5 of the macrocell A and wires 8 and 9 are placed between macrocell A and B.

However, the number of the wiring in the interval of vertex 5, top right of the macrocell A and vertex 6, bottom left of the macrocell B drops sharply compared with the case the area 7 is treated as a wiring area. Therefore, the interval of the macrocell B and the macrocell A had to be wider than the necessity, and there was a problem of increase in the layout area of the LSI.

FIG. 2 illustrates another layout of an LSI including macrocells in related art. There are macrocell A same as macrocell A shown in FIG. 1 and macrocell B placed in the right as shown in FIG. 2. The right side 4 of the macrocell A and the left side 22 of the macrocell B have terminals 11 and 12. Wires 14 connected to the terminals 11 and 12 are wired at the area between the macrocell A and the macrocell B.

In this case, wires 13 connected to the terminals 10 of the macrocell A need to be wired via the area between the macrocell A and the macrocell B since the area 7 are treated as a wiring prohibition area. Furthermore, the interval between the macrocell A and the macrocell B needs to wider than the case that the area 7 is treated as a wiring area since the wirings 13 are wired at the area between the macrocell A and the macrocell B. In this way, there was a problem of increase in the layout area of the LSI.

A technique that wiring channels are formed in the vacant spaces in the macrocells is disclosed (Japanese patent laid open publication No. 5-259283). However the macrocell according to the technique is a quadrilateral per se. And the wiring channels are formed in advance. They may be designed at the same time of design of the macrocells. In this way, the vacant area cannot be used freely at the time of the LSI design stage.

Furthermore, a technique that basic cell arrays are formed in the vacant spaces in the macrocells is disclosed (Japanese patent laid open publication No. 9-008142). However the macrocell according to the technique is a quadrilateral per se. And the basic cell arrays are formed in advance. They may be designed at the same time of design of the macrocells. In this way, the vacant area cannot be used freely in the LSI design stage.

SUMMARY OF THE INVENTION

The present invention is to provide an integrated circuit, a macrocell and layout method for an integrated circuit capable of reduction in chip area using an area in macrocells.

The macrocell according to the invention has concavity-shaped, and an integration circuit of the present invention includes a concave macrocell. The concave macrocell includes macrocells that is hollowed-shape, macrocells that has a recess. Macrocells are a kind of cells used in standard cells. Generally, macrocells has same functions as multiple cells. Macrocells are often used in the shape of a quadrilateral so that these macrocells include non-circuit areas that are areas that do not have circuits. The non-circuit area in an integrated circuit is efficiently used according to this invention, so that the reduction in chip area can be realized by using the integrated circuit including the macrocell. On the other hand, the reduction in chip area can be realized that the non-circuit areas are treated as free areas for wiring or placing cells.

A method of layout integrated circuit includes a step for input a macrocell, a step for searching for non-circuit area in the macrocell, a step for replacing the macrocell with a macrocell excluded the free areas, and a step for layout an integrated circuit using the macrocell.

According to this invention, non-circuit areas in the macrocell are treated as free areas so that necessary wiring can be carried out even intervals between macrocells are narrowed.

BRIEF DESCRIPTION OF THE DRAWINGS

The objects, features, and advantages of the present invention will become more apparent from the following description of the preferred embodiments taken in conjunction with the accompanying drawings, in which.

DESCRIPTION OF THE PREFERRED EMBODIMENTS

Figure 1:
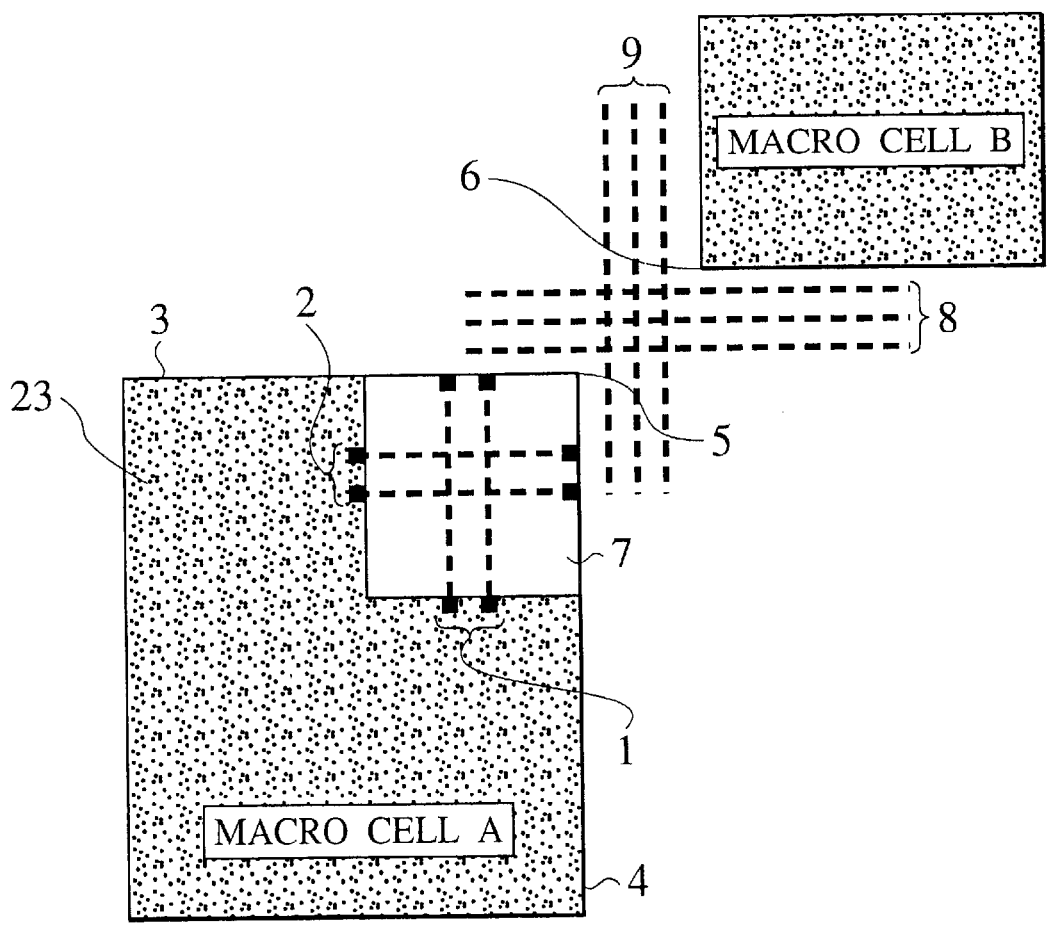
FIG. 1 illustrates a layout of an LSI including macrocells of related art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.
(Embodiments of Integrated Circuits and Macrocells)

Figure 3:
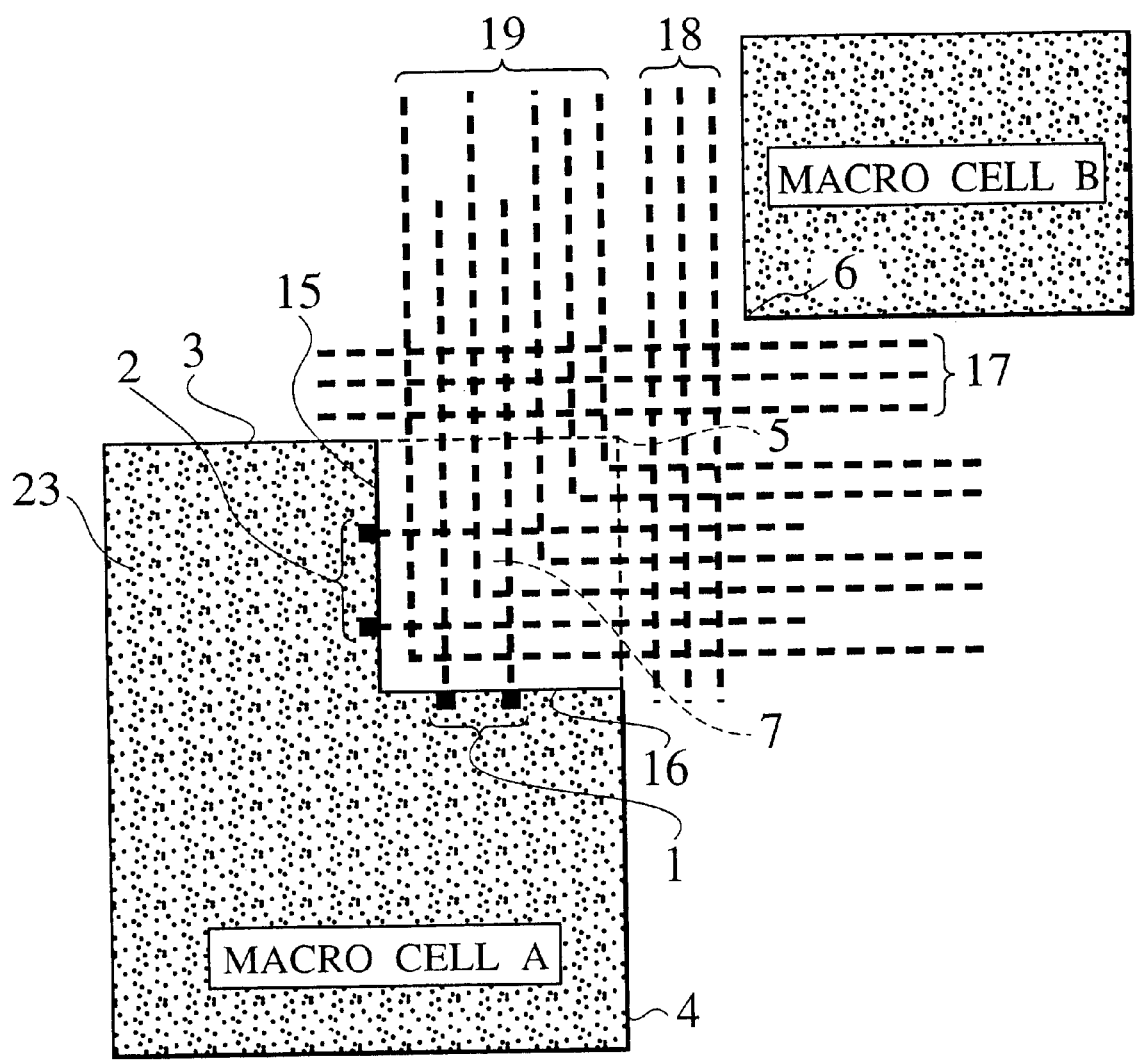
FIG. 3 illustrates a layout example of an integrated circuit according to the first embodiment of the present invention.

FIG. 3 illustrates a layout of an integrated circuit according to the first embodiment of the present invention. The integrated circuit according to the embodiment has a concavity-shaped macrocell A and a quadrilateral macrocell B as shown in FIG. 3. And the integrated circuit has wires 17, 18, and 19 to electrically connect macrocells, the sides 15 and 16 of the macrocell A have terminals 1 and 2 to electrically connect with other macrocells. The area 23 of the macrocell A is an area that has a circuit or circuits. There is a non-circuit area 7 at the right corner of the macrocell A. The area 7 is not treated as an area of macrocell A. When layout of an LSI using macrocell A is performed, the non-circuit area 7 that is an area that does not have circuits is treated as a free area. In this embodiment, the wires 19 are wired in the area 7.

The non-circuit area 7 in an integrated circuit is efficiently used according to this embodiment so that the wires 17 and 18 can be also wired even an interval between macrocell A and macrocell B is narrowed. In this way, reduction in layout area of an integrated circuit can be realized.

The macrocell A according to this embodiment has terminals 1 and terminals 2. But not limited to this embodiment, this invention can be realized that a macrocell has no terminals. Also, this invention can be realized that a macrocell has a terminal at either or all of upper, lower, right, and left sides.

Figure 4:
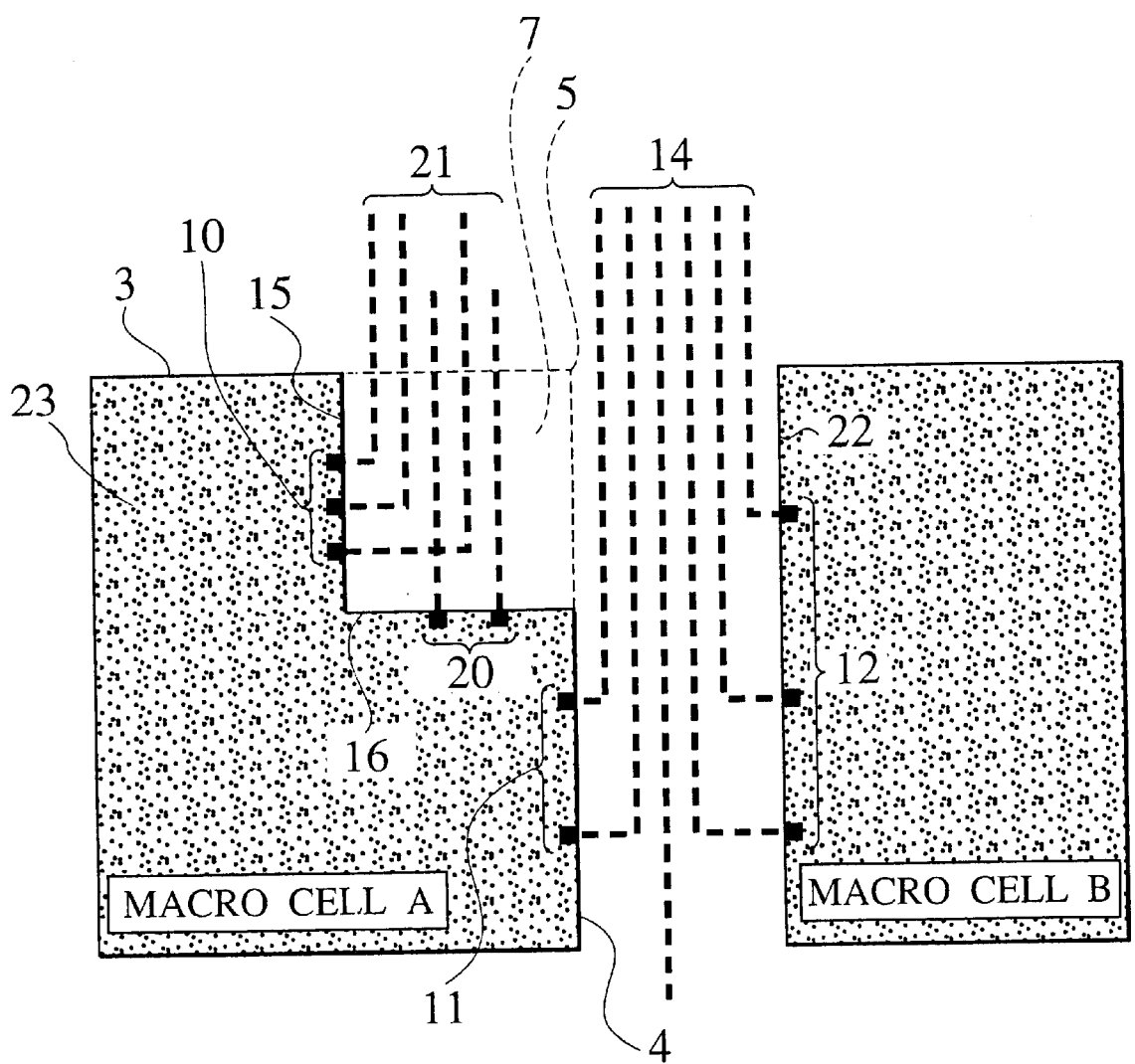
FIG. 4 illustrates a layout example of an integrated circuit according to the second embodiment of the present invention.

FIG. 4 illustrates a layout of an integrated circuit according to the second embodiment of the present invention. The integrated circuit according to the embodiment has a macrocell A that has concavity-shaped and a macrocell B that is quadrilateral. The macrocell B is placed in roughly parallel with the macrocell A. And the integrated circuit has wires 14 between the macrocell A and the macrocell B to electrically connect macrocells.

The macrocell A has terminals 10 at a side 15, terminals 20 at a side 16, and terminal 11 at a right side 4. The macrocell B has terminals 12 at a side 22. There is a non-circuit area 7 at the right corner of the macrocell A.

Figure 2:
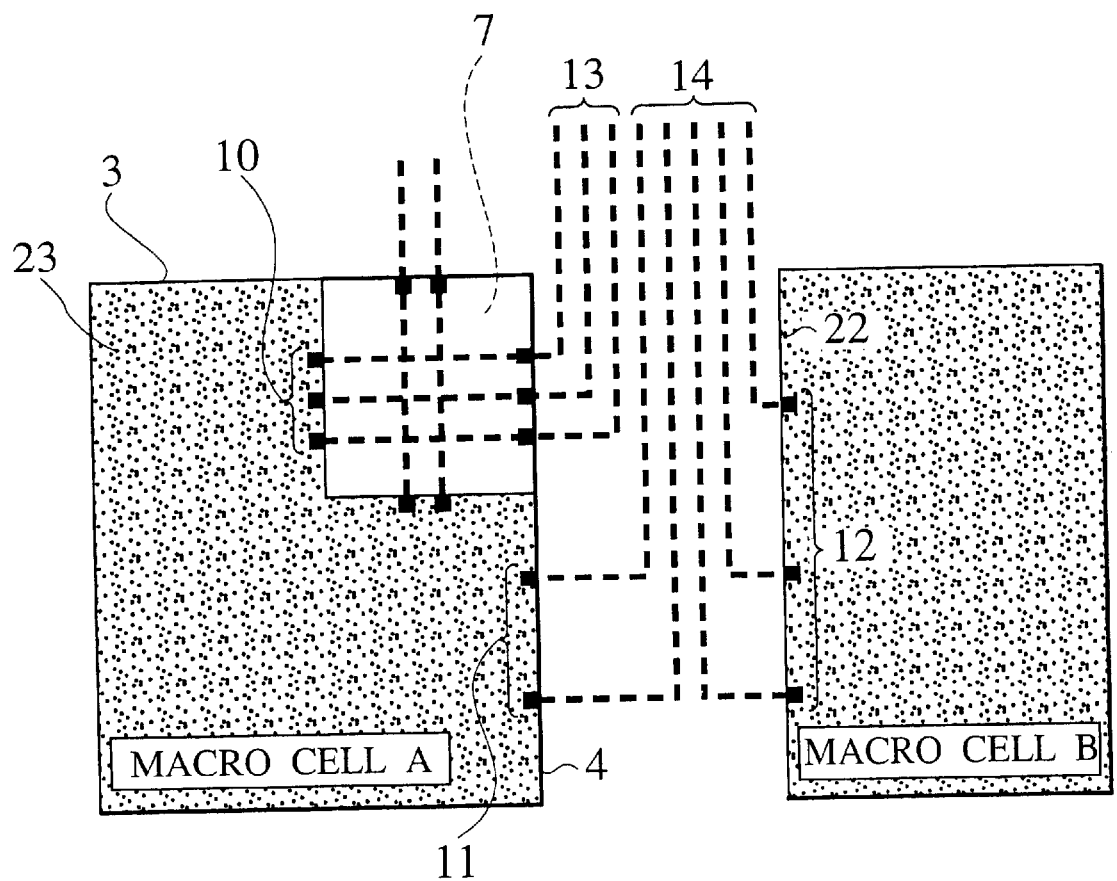
FIG. 2 illustrates another layout of an LSI including macrocells of related art.

The area of the macrocell A is an area that has a circuit or circuits. The area 7 is not treated as an area of macrocell A. When layout of an LSI using macrocell A is performed, the non-circuit area 7 that is an area that does not have circuits is treated as a free area. In this embodiment, the wires 21 are wired at the area 7. Contrary to this, in the related art described above, wires 13 connected to the terminals 10 of the macrocell A need to be wired via the area between the macrocell A and the macrocell B in FIG. 2.

The non-circuit area 7 in the integrated circuit is efficiently used according to this embodiment so that the wires 14 can be wired even an interval between the macrocell A and the macrocell B is narrowed. In this way, reduction in layout area of an integrated circuit can be realized.

The macrocell A according to this embodiment has the terminals 1 and the terminals 2. But not limited to this embodiment, this invention can be realized that a macrocell has no terminals. Also, this invention can be realized that a macrocell has a terminal at either or all of upper, lower, right, and left sides.

In above-mentioned two embodiments, the non-circuit area 7 is treated as an area that wires can be wired. As another embodiment, reduction in layout area of an integrated circuit can also be realized that the non-circuit area 7 is treated as an area that circuit blocks including macrocells and standard cells that is placed or partly placed.

Furthermore, in above-mentioned two embodiments are explained about macrocells. But not limited to this embodiment, reduction in layout area of an integrated circuit can also be realized by using circuit blocks or function blocks that have concavity-shaped.
(Embodiment of Layout Methods for Integrated Circuits)

Next, embodiments of layout methods for integrated circuit will be explained herein below. Software or hardware that implements the processing as described below is prepared and a computer system is used for enabling implementation of the layout methods for integrated circuits. The term 'computer system' may include a mainframe computer, workstation, PC, or the like. The hardware configuration of the computer system used in the present embodiment includes a CPU that performs various operations, an input device, such as a keyboard, a mouse, a light-pen, or a flexible disc device, an output device, such as a display or a printer, and other devices.

Figure 5:
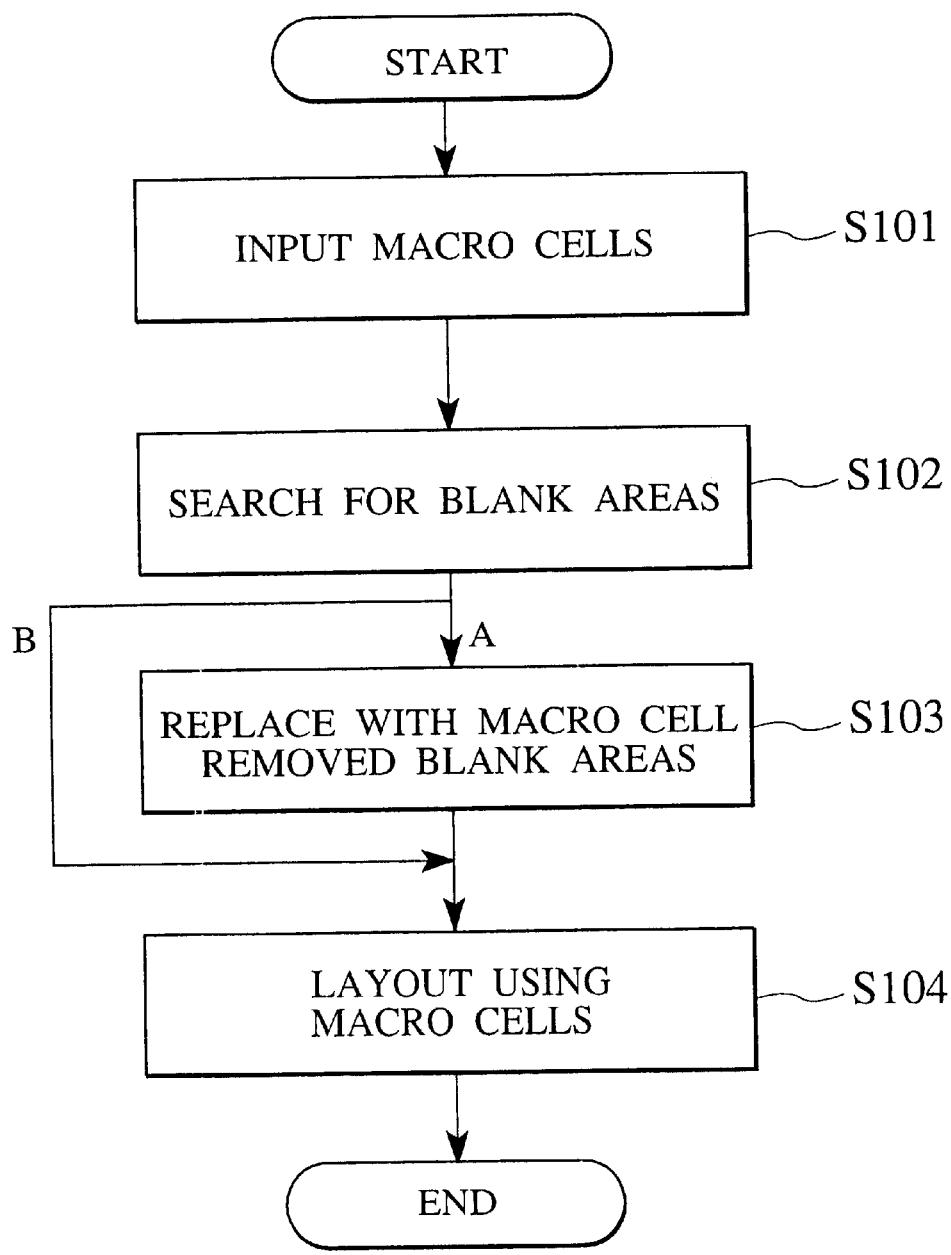
FIG. 5 illustrates a layout method for the integrated circuit according to the first embodiment of the present invention.

FIG. 5 illustrates a layout method for the integrated circuit according to the first embodiment of the present invention. First, a target macrocell is inputted (step S101). Next, blank areas in the macrocell are searched (step S102). Next, the macrocell is replaced with a macrocell removed blank areas (step S103). Finally, layout process is performed using the macrocell (step S104).

In this embodiment, the target macrocell is replaced with a macrocell removed blank areas in the step S103. As another embodiment, the target macrocell is used as it is, and in the following step S104, layout process is performed that the blank areas searched are treated as non-macrocell area so that the blank areas can be areas for wiring or placing macrocells or standard cells. In this case, step S103 may be skipped and the method proceeds to the step S104 after the step S102 (path B shown in FIG. 5).

Figure 6A:
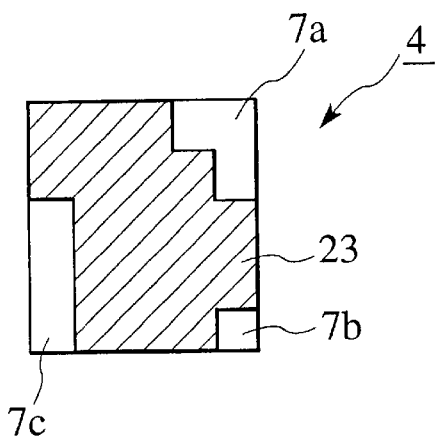
FIGS. 6A, 6B, and 6C illustrate an example of layout method for the integrated circuit according to the first embodiment of the present invention.
Figure 6B:
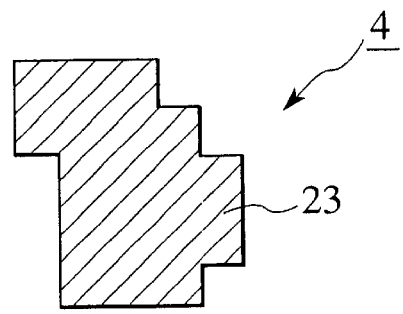
Figure 6C:
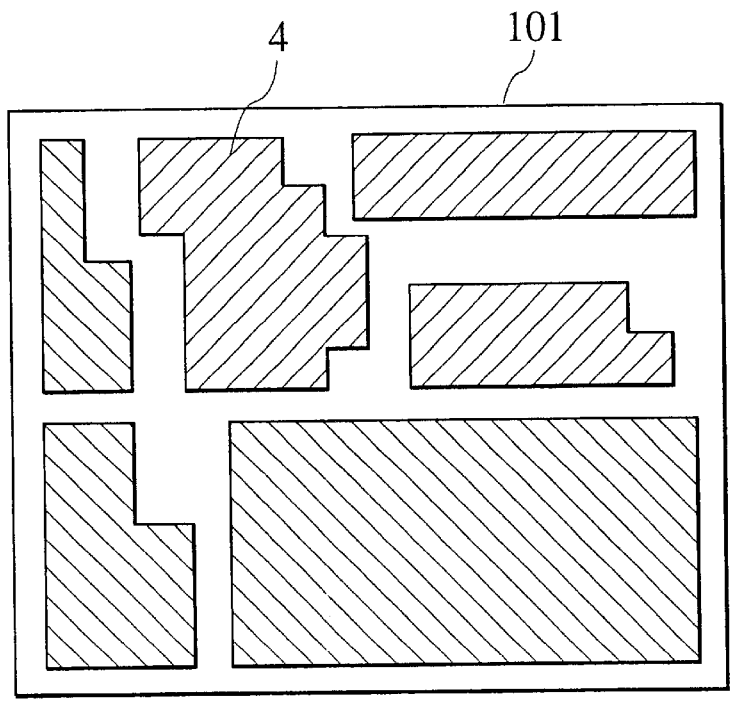

Next, an example of the embodiment will be explained in detail. FIGS. 6A, 6B, and 6C illustrate an example of layout method for the integrated circuit according to the first embodiment of the present invention. First, a target macrocell is inputted (step S101). The macrocell 4 in FIG. 6A is supposed to be inputted. Next, blank areas in the macrocell are searched (step S102). The macrocell 4 has circuit area 23 and blank areas (7a, 7b, and 7c). In this example, blank areas 7a, 7b, and 7c are supposed to be searched. Next, the macrocell is replaced with a macrocell removed blank areas (step S103). Blank areas 7a, 7b, and 7c are removed and a macrocell shown in FIG. 6B is generated. Finally, layout process is performed using the macrocell (step S104). An integrated circuit 101 is used the macrocell 4 removed the blank areas. The reduction in layout area of an integrated circuit can be realized to use of blank areas in macrocells.

Figure 7:
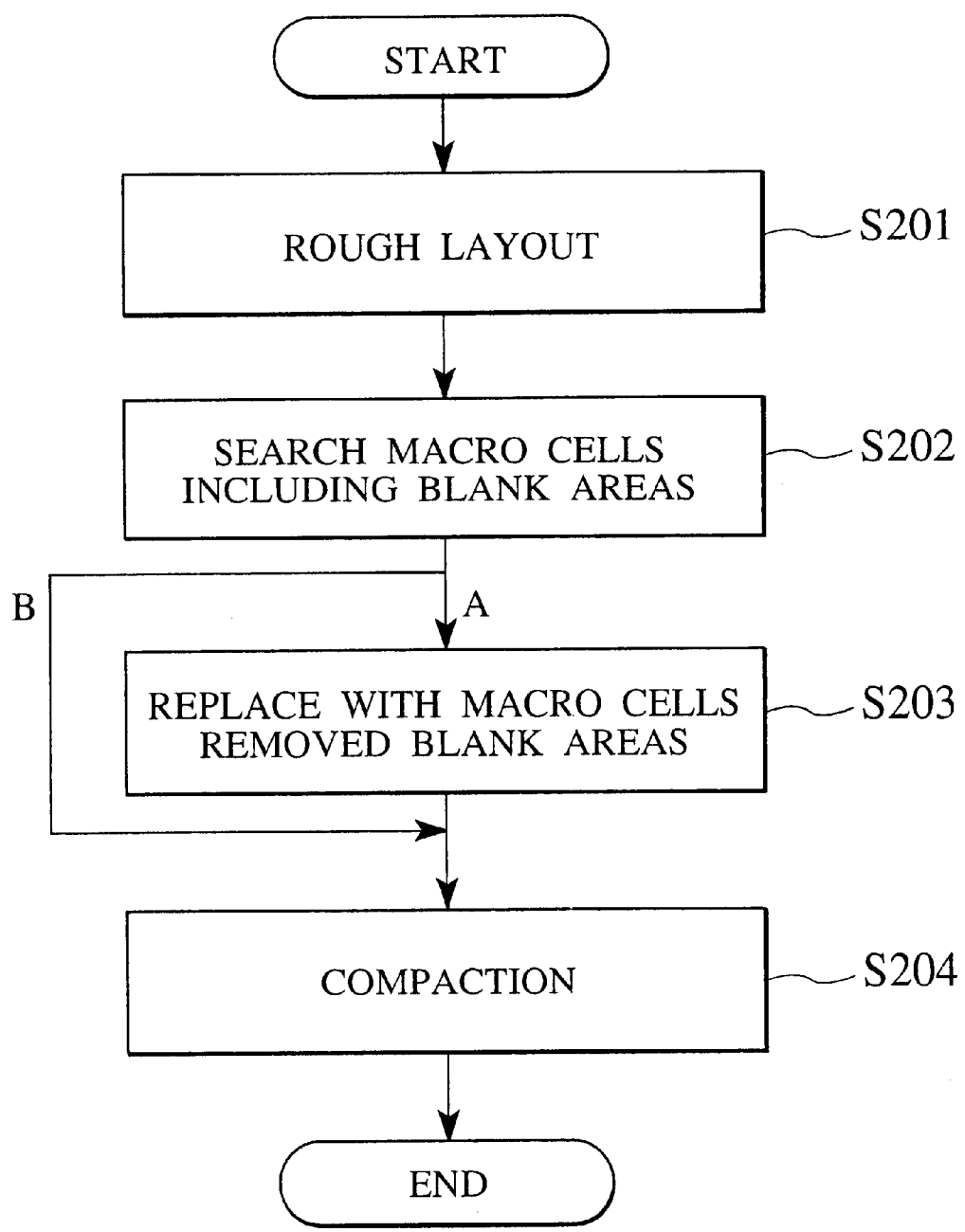
FIG. 7 illustrates a layout method for the integrated circuit according to the second embodiment of the present invention.

Next, second embodiment of layout methods for integrated circuit will be explained herein below. FIG. 7 illustrates a method of layout for the integrated circuit according to the second embodiment of the present invention. First, rough layout of an integrated circuit is performed (step S201). Next, macrocells that have blank areas are searched in the integrated circuit (step S202). Next, the macrocells searched is replaced with macrocells that is removed the blank areas (step S203). Finally, compaction of the integrated circuit including the macrocells removed the blank areas is performed (step S204).

In this embodiment, the target macrocell is replaced with a macrocell removed blank areas at the step S203. As another embodiment, the target macrocell is used as it is, and in the following step S204, compaction process is performed that the blank areas searched in step S202 are treated as non macrocell area so that the blank areas can be areas for wiring or placing macrocells or standard cells. In this case, step S203 may be skipped and the method proceeds to the step S204 after the step S202 (path B shown in FIG. 7).

Figure 8A:
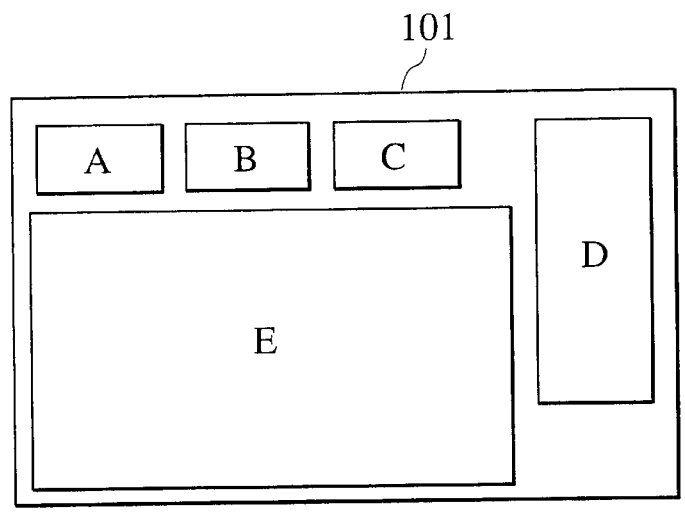
FIGS. 8A, 8B, and 8C illustrate an example of layout method for the integrated circuit according to the second embodiment of the present invention.
Figure 8B:
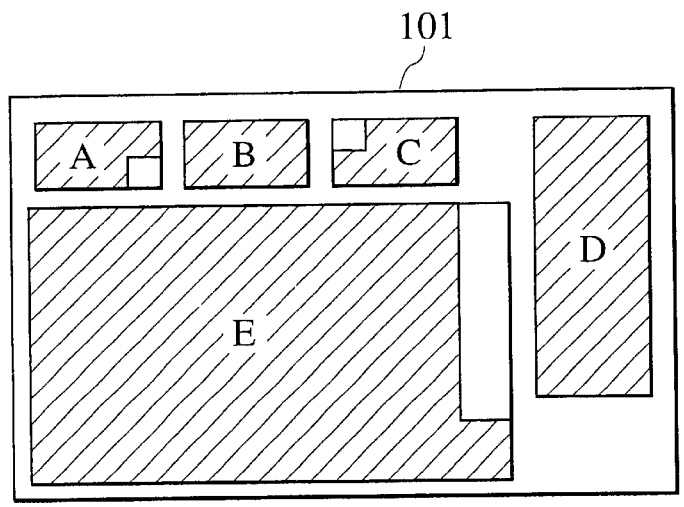
Figure 8C:
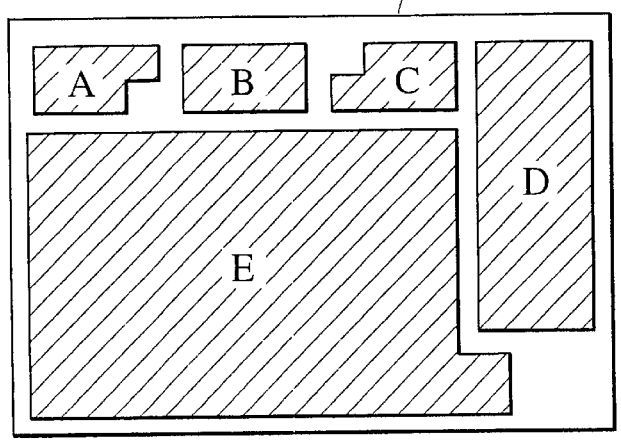

Next, an example of this embodiment will be explained in detail herein below. FIGS. 8A, 8B, and 8C illustrate an example of layout method for the integrated circuit according to the second embodiment of the present invention. First, rough layout of an integrated circuit is performed (step S201). A layout of an integrated circuit 101 shown in FIG. 8A is supposed to be performed. The integrated circuit 101 has a macrocell A, a macrocell B, a macrocell C, a standard cell D, and a macrocell E shown in FIG. 8A. Next, macrocells that have blank areas are searched in the integrated circuit (step S202). Blank spaces in FIG. 8B are searched as blank areas. The blank spaces in FIG. 8B shows areas that have no circuits and slanting lines area in FIG. 8B shows areas that have a circuit or circuits. Next, the macrocells searched is replaced with macrocells that is removed the blank areas (step S203). Finally, compaction of the integrated circuit including the macrocells removed the blank areas is performed (step S204). FIG. 8C illustrates an integrated circuit after the compaction process. The standard cell D is moved to the left of the FIG. 8C for the compaction process since the blank area of the macrocell E is removed and reduction in the area of the integrated circuit 101 can be realized. In this way, reduction in an integrated circuit can be realized to remove blank areas of the macrocell in the integrated circuit.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. An integrated circuit comprising:
  at least one macrocell, the macrocell has:
    a circuit area that has a circuit or circuits; and
    a non circuit area that has no circuits, a blank area is searched as the non circuit area, the non circuit area is treated as an area removed from the macrocell and the macrocell is replaced with a macrocell having the blank area removed.

2. The integrated circuit as claimed in claim 1, wherein the non circuit area is used for wiring in a design process of the integrated circuit.

3. The integrated circuit as claimed in claim 1, wherein non circuit area is used for placing a macrocell in a design process of the integrated circuit.

4. The integrated circuit as claimed in claim 1, wherein the non circuit area is used for placing a standard cell in a design process of the integrated circuit.

5. The method of layout for a integrated circuit comprising the steps of:
  inputting a target macrocell;
  searching for blank areas in the macrocell in the integrated circuit;
  removing the blank areas from the macrocell;
  replacing the macrocell with a macrocell that the blank area searched is removed; and
  laying out the integrated circuit using the macrocell that the blank area searched is removed.

6. The method as claimed in claim 5, further comprising a step of:
  generating a macrocell that the blank area searched is removed after the searching for blank areas in the macrocell.

7. The integrated circuit as claimed in claim 5, wherein the removed blank area is used for wiring in a design process of the integrated circuit.

8. The integrated circuit as claimed in claim 5, wherein the removed blank area is used for placing a macrocell in a design process of the integrated circuit.

9. The integrated circuit as claimed in claim 5, wherein the removed blank area is used for placing a standard cell in a design process of the integrated circuit.

10. A method of layout for an integrated circuit comprising the steps of:
  inputting a target macrocell;
  searching for blank areas in the macrocell in the integrated circuit,
  laying out the integrated circuit using the macrocell that has the searched blank area is treated as an area removed from the macrocell and the macrocell is replaced with a macrocell having the blank area removed.

11. The method as claimed in claim 10, wherein the blank area is used for wiring in a design process of the integrated circuit.

12. The method as claimed in claim 10, wherein the blank area is used for placing a macrocell in a design process of the integrated circuit.

13. The method as claimed in claim 10, wherein the blank area is used for placing a standard cell in a design process of the integrated circuit.

14. A method of layout for an integrated circuit comprising the steps of:
  roughly laying out the integrated circuit;
  searching for a blank area in the macrocell in the integrated circuit;
  removing the blank areas from the macrocell;
  replacing the macrocell that the blank area searched is removed; and
  compaction the intergrated circuit using the macrocell that the blank area searched is removed.

15. The integrated circuit as claimed in claim 14, wherein the removed blank areas are used for wiring in a design process of the integrated circuit.

16. The integrated circuit as claimed in claim 14, wherein the removed blank areas are used for placing a standard cell in a design process of the integrated circuit.

17. The integrated circuit as claimed in claim 14, wherein the removed blank areas are used for placing a standard cell in a design process of the integrated circuit.

* * * * *